US008806312B2

(12) United States Patent
Kamuf et al.

(10) Patent No.: US 8,806,312 B2
(45) Date of Patent: Aug. 12, 2014

(54) SOFT OUTPUT VITERBI ALGORITHM METHOD AND DECODER

(75) Inventors: Matthias Kamuf, Waghäusel (DE); Lay Hong Ang, Singapore (SG); Wee Guan Lim, Singapore (SG)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 243 days.

(21) Appl. No.: 13/389,907

(22) PCT Filed: Aug. 12, 2010

(86) PCT No.: PCT/EP2010/061760
§ 371 (c)(1),
(2), (4) Date: Mar. 5, 2012

(87) PCT Pub. No.: WO2011/020770
PCT Pub. Date: Feb. 24, 2011

(65) Prior Publication Data
US 2012/0159288 A1 Jun. 21, 2012

Related U.S. Application Data

(60) Provisional application No. 61/234,701, filed on Aug. 18, 2009.

(30) Foreign Application Priority Data

Apr. 15, 2010 (EP) .................................... 10159966

(51) Int. Cl.
*H03M 13/00* (2006.01)
*H03M 13/41* (2006.01)
*H03M 13/39* (2006.01)

(52) U.S. Cl.
CPC .............. *H03M 13/41* (2013.01); *H03M 13/39* (2013.01)
USPC .......................................... 714/795; 714/786

(58) Field of Classification Search
CPC ............ H03M 13/41; H03M 13/4107; H03M 13/4161; H03M 13/4115; H03M 13/4138; H03M 13/4146; H03M 13/39; H03M 13/3972; H03M 13/25; H03M 13/256; H04L 1/005; H04L 1/006; H04L 25/03203; H04L 25/4975; H04L 2201/06; G11B 20/0009

USPC .......... 714/792, 795, 796, 786, 794; 704/242; 375/265

See application file for complete search history.

(56) References Cited

U.S. PATENT DOCUMENTS 5,537,444 A * 7/1996 Nill et al. ...................... 375/341
6,697,443 B1 * 2/2004 Kim et al. ..................... 375/341

(Continued)

OTHER PUBLICATIONS

International Preliminary Report on Patentability, dated Mar. 1, 2012, in connection with International Application No. PCT/EP2010/061760.

(Continued)

*Primary Examiner* — Albert Decady
*Assistant Examiner* — Osman Alshack
(74) *Attorney, Agent, or Firm* — Leffler Intellectual Property Law, PLLC

(57) ABSTRACT

A method of decoding a block with a Soft Output Viterbi Algorithm (SOVA) using a trellis representation and a sliding window wherein each position of the sliding window has a path determination stage at one end of the sliding window and a symbol decision stage at another end of the sliding window is disclosed. The method comprises determining, for each path determination stage and for each node of the path determination stage, a surviving path (including a surviving path input symbol and a surviving decision stage node) and a concurrent path (including a concurrent path input symbol and a concurrent decision stage node) based on path metrics. A path metric disparity value is calculated and stored for each node. Based on decision criteria, a soft output value of the surviving decision stage node is determined as either of the path metric disparity value of the node of the path determination stage, a function of the path metric disparity value of the node of the path determination stage and the stored path metric disparity value of the concurrent decision stage node, and the stored path metric disparity value of the surviving decision stage node. Corresponding computer program product, decoder and communication apparatus are also disclosed.

14 Claims, 4 Drawing Sheets

(56) References Cited

U.S. PATENT DOCUMENTS

| | | | | |
|---|---|---|---|---|
| 6,829,313 | B1* | 12/2004 | Xu | 375/341 |
| 7,103,831 | B1* | 9/2006 | Krieger et al. | 714/792 |
| 7,120,207 | B2* | 10/2006 | Nordman | 375/341 |
| 7,234,100 | B1* | 6/2007 | Sadowsky | 714/792 |
| 7,752,531 | B2* | 7/2010 | Patapoutian et al. | 714/795 |
| 7,908,545 | B2* | 3/2011 | Hepler et al. | 714/796 |
| 7,930,617 | B1* | 4/2011 | Gass et al. | 714/784 |
| 2002/0157058 | A1* | 10/2002 | Ariel et al. | 714/774 |
| 2003/0056166 | A1* | 3/2003 | Kim et al. | 714/755 |
| 2008/0152045 | A1* | 6/2008 | Efimov et al. | 375/341 |
| 2009/0132896 | A1* | 5/2009 | Valadon | 714/792 |

OTHER PUBLICATIONS

European Patent Office Article 94(3) Communication, dated Mar. 19, 2012, in connection with counterpart European Patent Application No. 10 159 966.0-2218.

Ang, Lay Hong et al. "SOVA Based LTE Turbo Decoders" Master's Thesis, Lund University, Sweden, Aug. 2009.

Extended European Search Report, dated Mar. 19, 2012, in connection with European Patent Application No. 11 19 0056.

PCT International Search Report, mailed Dec. 6, 2010, in connection with International Application No. PCT/EP2010/061760.

Li, Hsin-Yih "A Modified Soft-Output Viterbi Algorithm for Punctured Turbo-Codes", Master Thesis, Dept. Electrical Engineering, National Cheng Kung University, Tainan, Taiwan, Jul. 2006, Sep. 9, 2006, pp. 1-78, XP002601407.

Takeshita, O. Y. et al. "Asymmetric turbo-codes" INFORMPROC., IEEE International Symposium on Information Theory, ISIT'98, Cambridge, MA, USA, Aug. 16-21, 1998, p. 179, XP010297107.

Joeressen, O. J. et al. "High-Speed VLSI Architectures for Soft-Output Viterbi Decoding" Journal of VLSI Signal Processing Systems for Signal, Image, and Video Technology, Springer, New York, NY, US, vol. 8, No. 2, Oct. 1, 1994, pp. 169-181, XP000483302, ISSN: 0922-5773, DOI: 10.1007/BF02109383.

Ang, L. H. et al. "Modification of SOVA-based Algorithms for Efficient Hardware Implementation" Proc. IEEE Vehicular Technology Conference, VTC 2010-Spring, Taipei, Taiwan, May 16-19, 2010, pp. 1-5, XP002602413, ISBN: 978-1-4244-2518-1.

Fossorier, M. P. C. et al. "On the Equivalence Between SOVA and MAX-Log-MAP Decodings" IEEE Communications Letters, IEEE Service Center, Piscataway, NE, US, vol. 2, No. 5, May 1, 1998, XP011010575, ISSN: 1089-7798.

Hagenauer, J. et al. "Iterative decoding of binary block and convolutional codes", IEEE Trans. Inf. Theory, vol. 42, No. 2, pp. 429-445, Mar. 1996.

Bahl, L.R. et al. "Optimal decoding of linear codes for minimizing symbol error rate", IEEE Trans. Inf. Theory, vol. 20, No. 2, pp. 284-287, Mar. 1974.

Robertson, P. et al. "A comparison of optimal and sub-optimal MAP decoding algorithms operating in the log domain", Proc. IEEE Intl. Conf. Comm., Seattle, WA, Jun. 1995, pp. 1009-1013.

Hagenauer, J. et al. "A Viterbi algorithm with soft-decision output and its applications", Proc. IEEE Globecom, Dallas, TX, Nov. 1989, pp. 1680-1686.

Yeo, E. et al. "A 500 Mbit/s soft output Viterbi decoder", IEEE J. Solid-State Circuits, vol. 38, No. 7, pp. 1234-1241, Jul. 2003.

Abstract of Battail, G. "Ponderation des symboles decodes par l'algorithme de Viterbi" Annales des Telecommunications, No. 1-2, pp. 31-38, Jan.-Feb. 1987 (See Application Specification, p. 4, Line 5.).

* cited by examiner

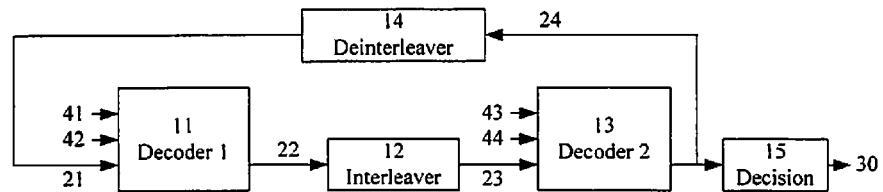
Fig. 1A
(Prior Art)
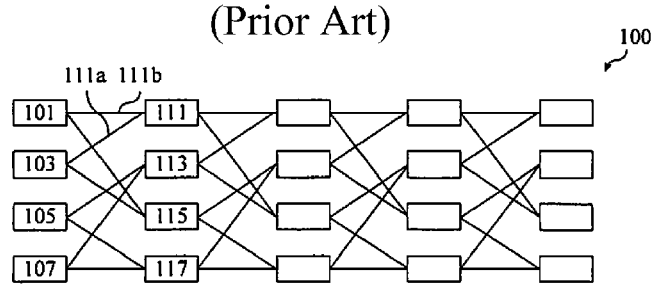
Fig. 1B
(Prior Art)
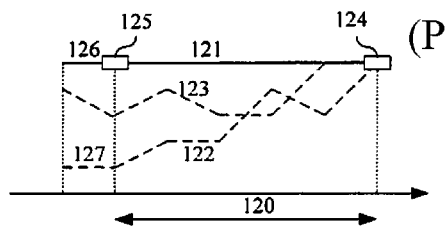
Fig. 1C (Prior Art)
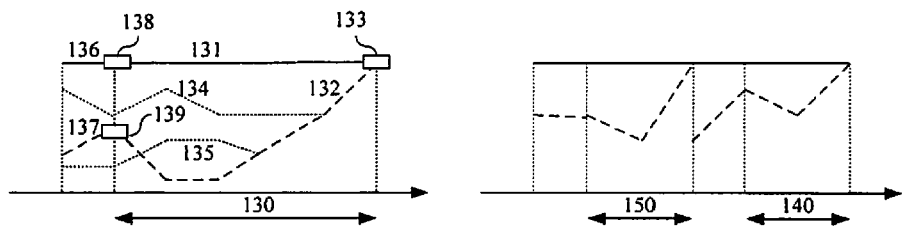
Fig. 1D
(Prior Art)
Fig. 1E

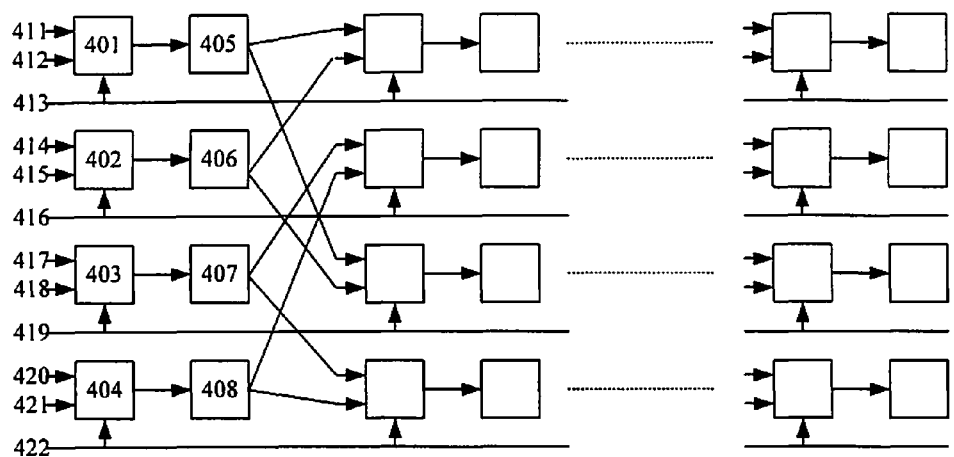
Fig. 4A
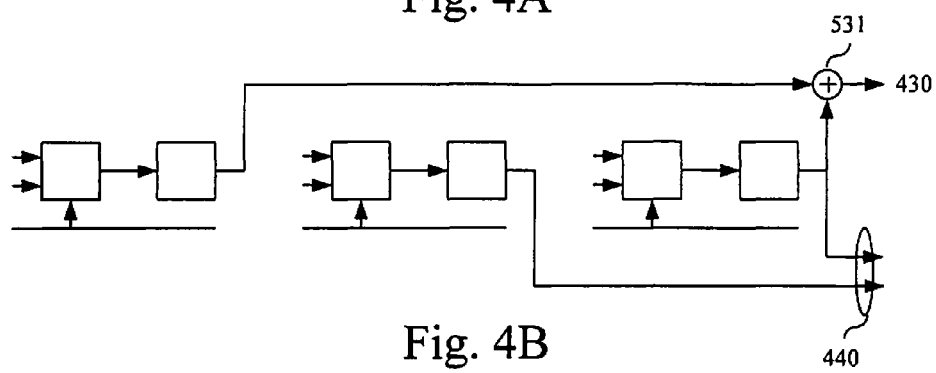
Fig. 4B
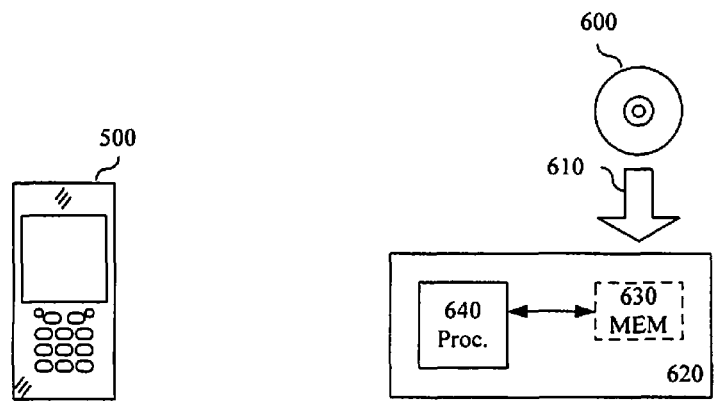
Fig. 5
Fig. 6

SOFT OUTPUT VITERBI ALGORITHM METHOD AND DECODER

CROSS-REFERENCE TO RELATED APPLICATIONS

This application claims priority under 35 U.S.C. §119 to European Patent Application No. 10159966.0, filed Apr. 15, 2010, which is hereby incorporated herein by reference in its entirety. This application also claims the benefit of U.S. Provisional Application No. 61/234,701, filed Aug. 18, 2009, which is hereby incorporated herein by reference in its entirety.

TECHNICAL FIELD

The present invention relates generally to the field of decoding of error correcting codes. More particularly, it relates to decoding of trellis codes.

BACKGROUND

The principle of iterative decoders is described, for example, in J. Hagenauer, E. Offer, and L. Papke, "Iterative decoding of binary block and convolutional codes", IEEE Trans. Inf. Theory, vol. 42, no. 2, pp. 429-445, March 1996. Typically, iterative decoding may be based on exchange of de-correlated extrinsic information between soft-input soft-output (SISO) constituent decoders.

FIG. 1A illustrates an example implementation of iterative decoding using such a setup of constituent SISO decoders 11 and 13 which may be suitable for decoding of e.g. a turbo code with rate 1/2 constituent codes.

In this example, received intrinsic soft values representing two code bits (code symbols in more general cases) are input to the first SISO decoder 11 (Decoder 1) as illustrated by reference numbers 41 and 42. Decoder 1 outputs extrinsic soft values for each information bit (or more generally each information symbol) as illustrated by reference number 22, and the extrinsic soft values are interleaved in an interleaver 12.

The interleaved extrinsic soft values are input to the second SISO decoder 13 (Decoder 2) as illustrated by reference number 23, together with the received intrinsic soft values as illustrated by reference numbers 43 and 44 (after interleaving as applicable depending on the particular code setup). Decoder 2 outputs extrinsic soft values for each information bit as illustrated by reference number 24. The extrinsic soft values are deinterleaved in a deinterleaver 14 and fed back to Decoder 1 to serve as input of a second iteration as illustrated by reference number 21, together with the received intrinsic soft values. In the first iteration the input 21 is fed with neutral soft values.

This iterative exchange of extrinsic information gradually improves the reliability of the extrinsic information. After an appropriate number of iterations, a hard decision 30 may be taken in relation to each information bit in a decision unit 15 based on extrinsic soft values output from Decoder 2.

The operation of each of the SISO modules 11, 13 of FIG. 1A may typically be illustrated using a trellis diagram. FIG. 1B illustrates part of an example trellis diagram 100 representing an example constituent code of a turbo code. In this particular example, each stage of the trellis has four nodes (101, 103, 105, 107 for the first stage, 111, 113, 115, 117 for the second stage, etc.), where each node represents a state of the corresponding encoder. Furthermore, this example trellis has two incoming paths to each node (e.g. 111$a$, 111$b$ for node 111). Trellis diagrams are very well known in the art and will therefore not be described in greater detail.

The SISO modules themselves may consist of (variants of) the BCJR (Bahl, Cocke, Jelinek, Raviv) algorithm (known from L. R. Bahl et al., "Optimal decoding of linear codes for minimizing symbol error rate", IEEE Trans. Inf. Theory, vol. 20, no. 2, pp. 284-287, March 1974 and from P. Robertson, P. Höher, and E. Villebrun, "A comparison of optimal and sub-optimal MAP decoding algorithms operating in the log domain", Proc. IEEE Intl. Conf. Comm., Seattle, June 1995, pp. 1009-1013 for the logarithmic domain).

However, the BCJR algorithm and its variants suffer from a considerable amount of complexity. To fulfill throughput requirements of some applications an implementation in dedicated hardware may often be required as well as advanced parallelization techniques.

Another possibility for the SISO modules is (variants of) an approach based on the traditional Viterbi algorithm, namely the soft-output Viterbi algorithm (SOVA) disclosed in J. Hagenauer and P. Höher, "A Viterbi algorithm with soft-decision output and its applications", Proc. IEEE Globecom, Dallas, November 1989, pp. 1680-1686.

Typically, SOVA provides soft output values at a lower complexity cost than the BCJR algorithm. Another advantage of SOVA is a reduction in latency compared to BCJR. Latency of SOVA basically depends on the depth of the decoding window (as known from traditional Viterbi decoding). SOVA may also have the advantage of less parallelization required. In some situations, however, the SOVA suffers from a worse error rate performance than the BCJR algorithm.

As known in the art, SOVA may initially assign a reliability value L to each node of the trellis, where the reliability value depends on the path metrics of the incoming paths of the node. For a trellis with two incoming paths to each node, the initial reliability value may be the absolute value of the difference between the metrics of the two incoming paths, $L \leftarrow \Delta = |M(s')-M(s'')|$, where s' and s'' are the two incoming paths and M(s) is the path metric of path s. The path metric may for example, be a cumulative metric.

In some applications SOVA uses the following update rule, often termed the Hagenauer rule, for the reliability values:

$L_{k-U}(s) \leftarrow \min(L_k(s), L_{k-U}(s))$ if $u_{k-U}(s) \neq u_{k-U}(c)$ and $L_{k-U}(s)$ unchanged otherwise, where $L_{k-U}(s)$ denotes the reliability value of the node of a surviving path at stage k-U. The notations used may be illustrated in a schematic trellis diagram as the one shown in FIG. 1C.

In the example of FIG. 1C, the SOVA applies a sliding window 120 of length U, which is currently in position k. A surviving path s for the uppermost node 124 at stage k is denoted with reference number 121 and has a corresponding decision bit (or more generally—decision symbol) $u_{k-U}(s)$, denoted by reference number 126, at stage k-U. Its concurrent path c is denoted with reference number 122 and has a corresponding decision bit $u_{k-U}(c)$, denoted by reference number 127, at stage k-U. At stage k-1 the node of the surviving path has a concurrent path denoted by reference number 123.

Thus, if the decision bits 126 and 127 differs and if the reliability value of the node 124 of the surviving path at stage k is lower than the reliability value of the node 125 of the surviving path at stage k-U, the Hagenauer rule suggests that the reliability value of node 125 should be replaced by the reliability value of node 124.

We denote a SOVA applying the Hagenauer update rule as HR-SOVA. Hardware architectures using the Hagenauer rule are know from E. Yeo et al., "A 500 Mbit/s soft output Viterbi decoder", IEEE J. Solid-State Circuits, vol. 38, no. 7, pp. 1234-1241, July 2003.

The update rule applied for the reliability values affects the quality (e.g. accuracy) of the extrinsic soft output values and thus the overall performance of the iterative decoder.

Another reliability value update rule that may be used with SOVA in the SISO modules is the Battail rule known from G. Battail, "Pondération des symboles décodés par l'algorithme de Viterbi", Annales des Télécommuncations, No. 1-2, pp. 31-38, January-Febuary 1987. We denote a SOVA applying the Battail update rule as BR-SOVA.

The Battail rule is equivalent in terms of performance to max-log-MAP (maximum aposteriori) decoding as illustrated in M. Fossorier et al., "On the equivalence between SOVA and max-log-MAP decodings", IEEE Comm. Letters, vol. 2, no. 5, pp. 137-139, May 1998. However, the complexity increase of this update rule compared to the Hagenauer rule is troublesome, and prevents or at least severely obstructs any hardware implementations. The complexity of the Battail rule also counteracts the complexity reduction achieved by using SOVA in stead of BCJR.

For HR-SOVA only the metric differences along the survivor path are considered for updating the reliability values. For BR-SOVA the metric differences along the concurrent path are also used in the updating. This is the cause of the, potential many-fold, increase in complexity of BR-SOVA.

The Battail rule for updating of reliability values may be expressed as:

$L_{k-U}(s) \leftarrow \min(L_k(s), L_{k-U}(s))$ if $u_{k-U}(s) \neq u_{k-U}(c)$ and
$L_{k-U}(s) \leftarrow \min(L_k(s) + L_{k-U}(c), L_{k-U}(s))$ if $u_{k-U}(s) = u_{k-U}(c)$.

The Battail update rule may be illustrated in a schematic trellis diagram as the one shown in FIG. 1D.

In the example of FIG. 1D, the SOVA applies a sliding window 130 of length U, which is currently in position k. A surviving path s for the uppermost node 133 at stage k is denoted with reference number 131 and has a corresponding decision bit $u_{k-U}(s)$, denoted by reference number 136, at stage k-U. Its concurrent path c is denoted with reference number 132 and has a corresponding decision bit $u_{k-U}(c)$, denoted by reference number 137, at stage k-U.

Now, if the decision bits 136 and 137 are equal, the Battail rule suggests that the reliability value of node 138 may be replaced by a sum of the reliability value of node 133 and the reliability value of node 139. Thus, to evaluate of this replacement should take place and, if applicable, perform the replacement, the reliability value of node 139 must first be determined which involves evaluation of the secondary concurrent paths (134, 135, etc.) and results in a complexity increase and a latency increase.

The size and complexity of implementations of a turbo decoder may be an important implementation parameter as well as latency. At the same time, acceptable error rate performance should typically be achieved.

In some scenarios, parallelization is required to meet latency requirements. This may particularly be the case if BCJR-like algorithms are applied. Such parallelization further enhances the importance of small size modules.

On the other hand, low-latency SOVA-type algorithms require a complicated update procedure if MAP baseline performance is to be fully maintained as elaborated on above.

Thus, there is a need for improved SISO algorithms for decoding methods and decoders. Preferably, the improved algorithms should have low latency, low complexity and good error rate performance.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of the invention to obviate at least some of the above disadvantages and to provide improved SISO algorithms for decoding methods and decoders.

According to a first aspect of the invention, this is achieved by a method of decoding a block with a Soft Output Viterbi Algorithm (SOVA), wherein the block comprises a plurality of symbols having a mutual association described by a trellis representation, the trellis representation having a node for each possible state of an encoder corresponding to the trellis representation and for each stage corresponding to a symbol input occasion of the encoder, each node having at least two incoming path transitions wherein each incoming path transition corresponds to a respective possible input symbol of the encoder, and wherein the SOVA uses a sliding window wherein each position of the sliding window has a path determination stage at one end of the sliding window and a symbol decision stage at another end of the sliding window.

In some embodiments, the block is encoded by an encoder of a code having a trellis representation (e.g. a convolutional code).

The method comprises determining soft output values of the SOVA. This is achieved by (for each path determination stage and for each node of the path determination stage) calculating a transition metric and a corresponding path metric for each incoming path transition, determining a surviving path and a concurrent path based on the path metrics, calculating a path metric disparity value based at least on the path metric of the surviving and concurrent paths, storing the path metric disparity value for the node of the path determination stage, and determining a surviving path input symbol corresponding to a path transition of the surviving path at the decision stage, a surviving decision stage node which has the path transition of the surviving path at the decision stage as an incoming path transition, a concurrent path input symbol corresponding to a path transition of the concurrent path at the decision stage, and a concurrent decision stage node which has the path transition of the concurrent path at the decision stage as an incoming path transition.

The soft output value of the surviving decision stage node is determined as the path metric disparity value of the node of the path determination stage, if the surviving path input symbol differs from the concurrent path input symbol and if the path metric disparity value of the node of the path determination stage is less than the stored path metric disparity value of the surviving decision stage node.

If the surviving path input symbol is equal to the concurrent path input symbol and if the function of the path metric disparity value of the node of the path determination stage and the stored path metric disparity value of the concurrent decision node is less than the stored path metric disparity value of the surviving decision stage node, the soft output value of the surviving decision stage node is determined as a function of the path metric disparity value of the node of the path determination stage and the stored path metric disparity value of the concurrent decision stage node.

Otherwise the soft output value of the surviving decision stage node is determined as the stored path metric disparity value of the surviving decision stage node.

In some embodiments, the transition and path metrics may be cumulative metrics.

The function may be a summation according to some embodiments.

In some embodiments, the step of calculating the path metric disparity value may comprise calculating an absolute value of the difference between the path metrics of the surviving and concurrent paths.

The at least two incoming path transitions of each node may consist of exactly two incoming path transitions according to some embodiments.

The sliding window may, according to some embodiments, be a first sliding window and the determined soft output values may be intermediate soft output values. In such embodiments, the method may further comprise applying a second sliding window, wherein the first and second sliding windows are non-overlapping. For each path determination stage of the second sliding window and for each node of the path determination stage, a soft output value of the surviving decision stage node of the second sliding window may be determined based on at least one of the intermediate soft output values using different criteria than in the first sliding window.

The different criteria may comprise determining the soft output value of the surviving decision stage node as the intermediate soft output value of the surviving decision stage node if the surviving path input symbol is equal to the concurrent path input symbol.

A second aspect of the invention is a computer program product comprising a computer readable medium, having thereon a computer program comprising program instructions. The computer program is loadable into a data-processing unit and adapted to cause the data-processing unit to execute the method steps of the first aspect of the invention when the computer program is run by the data-processing unit.

A third aspect of the invention is a decoder adapted to decode a block using SOVA.

The decoder comprises a metric calculation unit adapted to, for each path determination stage and for each node of the path determination stage, calculate a transition metric and a corresponding path metric for each incoming path transition, and calculate a path metric disparity value based at least on the path metric of a surviving path and a concurrent path.

The decoder also comprises at least one disparity value register unit adapted to store, for each stage and node of the sliding window, the corresponding path metric disparity value.

A survivor path unit of the decoder is adapted to, for each path determination stage and for each node of the path determination stage, determine the surviving path based on the path metrics, and determine a surviving path input symbol corresponding to a path transition of the surviving path at the decision stage, and a surviving decision stage node which has the path transition of the surviving path at the decision stage as an incoming path transition.

A path comparison unit of the decoder is adapted to, for each path determination stage and for each node of the path determination stage, determine the concurrent path based on the path metrics, determine a concurrent path input symbol corresponding to a path transition of the concurrent path at the decision stage, and a concurrent decision stage node which has the path transition of the concurrent path at the decision stage as an incoming path transition, and determine if the surviving path input symbol differs from the concurrent path input symbol.

The decoder further comprises a soft output value unit adapted to, for each path determination stage and for each node of the path determination stage, determine a soft output value of the surviving decision stage node.

The soft output value of the surviving decision stage node is determined as the path metric disparity value of the node of the path determination stage, if the surviving path input symbol differs from the concurrent path input symbol and if the path metric disparity value of the node of the path determination stage is less than the stored path metric disparity value of the surviving decision stage node.

If the surviving path input symbol is equal to the concurrent path input symbol and if the function of the path metric disparity value of the node of the path determination stage and the stored path metric disparity value of the concurrent decision node is less than the stored path metric disparity value of the surviving decision stage node, the soft output value of the surviving decision stage node is determined as a function of the path metric disparity value of the node of the path determination stage and the stored path metric disparity value of the concurrent decision stage node.

Otherwise the soft output value of the surviving decision stage node is determined as the stored path metric disparity value of the surviving decision stage node.

In some embodiments, the at least two incoming path transitions of each node may consist of two incoming path transitions and the decoder may further comprise a state register exchange unit wherein each register cell, corresponding to a node of the sliding window, and each register exchange connection, corresponding to a path transition between nodes, has a word length equal to one.

In such embodiments, the decoder may further comprise means to extract at least one of the concurrent decision stage node and the concurrent path input symbol from the state register exchange unit, wherein the means are adapted to extract the concurrent decision stage node by combining register cell content and/or to extract the concurrent path input symbol by application of an encoding polynomial of the encoder on register cell content.

A fourth aspect of the invention is a radio communication apparatus comprising the decoder of the third aspect of the invention.

In some embodiments, the third and fourth aspects of the invention may additionally have features identical with or corresponding to any of the various features as explained above for the first aspect of the invention.

It is to be noted that embodiments of the invention are applicable to all codes that may be represented by a trellis. Examples of such codes are the class of convolutional codes. Other examples include e.g. speech recognition applications.

An advantage of some embodiments of the invention is that the computational complexity and/or latency is improved (decreased) compared to BR-SOVA and/or BCJR.

Another advantage of some embodiments of the invention is that the complexity of implementations of a turbo decoder may be lowered. In some embodiments, the lower complexity is due to that a lower degree of parallelization is required to achieve a particular throughput.

Another advantage of some embodiments of the invention is that the error rate performance is improved (decreased error probability) compared to HR-SOVA.

Another advantage of some embodiments of the invention is that the error rate performance is comparable to that of BR-SOVA and/or BCJR.

BRIEF DESCRIPTION OF THE DRAWINGS

Further objects, features and advantages of the invention will appear from the following detailed description of embodiments of the invention, with reference being made to the accompanying drawings, in which:

FIG. 1A is a block diagram illustrating a known iterative decoder structure;

FIG. 1B is a schematic drawing illustrating a trellis representation of a known example code;

FIGS. 1C-D are schematic drawings illustrating known sliding windows;

FIG. 1E is a schematic drawing illustrating application of two non-overlapping sliding windows, each using a different update rule according to some embodiments of the invention;

FIGS. 4A-B are block diagrams illustrating register unit arrangements according to some embodiments of the invention;

FIG. 5 is a schematic drawing illustrating a mobile terminal, wherein the mobile terminal may comprise an arrangement according to some embodiments of the invention; and FIG. 6 is a schematic drawing illustrating a computer program product according to some embodiments of the invention.

DETAILED DESCRIPTION

In the following, embodiments of the invention will be described where a modified update rule for SOVA is applied. The modified update rule results in a reduced complexity compared to BR-SOVA while achieving better error rate performance than HR-SOVA.

The modified update rule for updating of reliability values may, according to some embodiments, be expressed as:

$L_{k-U}(s) \leftarrow \min(L_k(s), L_{k-U}(s))$ if $u_{k-U}(s) \neq u_{k-U}(c)$ and
$L_{k-U}(s) \leftarrow \min(L_k(s) + \Delta_{k-U}(c), L_{k-U}(s))$ if $u_{k-U}(s) = u_{k-U}(c)$, where $\Delta_{k-U}(c)$ is the initial reliability value of $u_{k-U}(c)$. Thus, this modified update rule uses initial reliability values (i.e. metric differences) of the concurrent path in stead of (possibly updated) reliability values as in the Battail rule. Therefore, there is no need to update the reliability values along the concurrent path, which radically improves latency and complexity of the algorithm.

In the Battail rule, $L_{k-U}(c)$ is supposed to be updated with the minimum reliability value among its possible concurrent paths, i.e. $\min_{c'}(L_{k-U}(c'))$, where $c'$ represents a concurrent path of the concurrent path (i.e. a secondary concurrent path). Therefore, it can be deduced that $\Delta_{k-U}(c) \geq L_{k-U}(c)$, which implies that $L_k(s) + \Delta_{k-U}(c) \geq L_k(s) + L_{k-U}(c)$. This implies that, in the modified update rule, $L_{k-U}(s)$ is updated with a value larger than in the Battail rule, which means that is less likely for the update value to be smaller than $L_{k-U}(s)$. Therefore, $L_{k-U}(s)$ is updated less often in the modified update rule than in BR-SOVA.

An implementation advantage of SOVA with the modified update rule is that the update of $L_{k-U}(s)$ can be performed without a delay due to having to update $L_{k-U}(c)$ first. This decreases complexity and latency. In some implementations SOVA with the modified update rule may also require less memory than BR-SOVA.

In some embodiments, the modified update rule is applied in a first sliding window and another update rule (e.g. the Hagenauer rule) is applied in a second sliding window. Such an approach may decrease complexity further without severely affecting the error rate performance.

In general, two non-overlapping sliding windows may be applied, where the sliding windows use different update rules (which may not necessarily comprise the modified update rule). For example, the first sliding window may use the Battail rule and the second may use the Hagenauer rule. This setup is illustrated in FIG. 1E, where two non-overlapping sliding windows 140 and 150 are illustrated.

Figure 2:
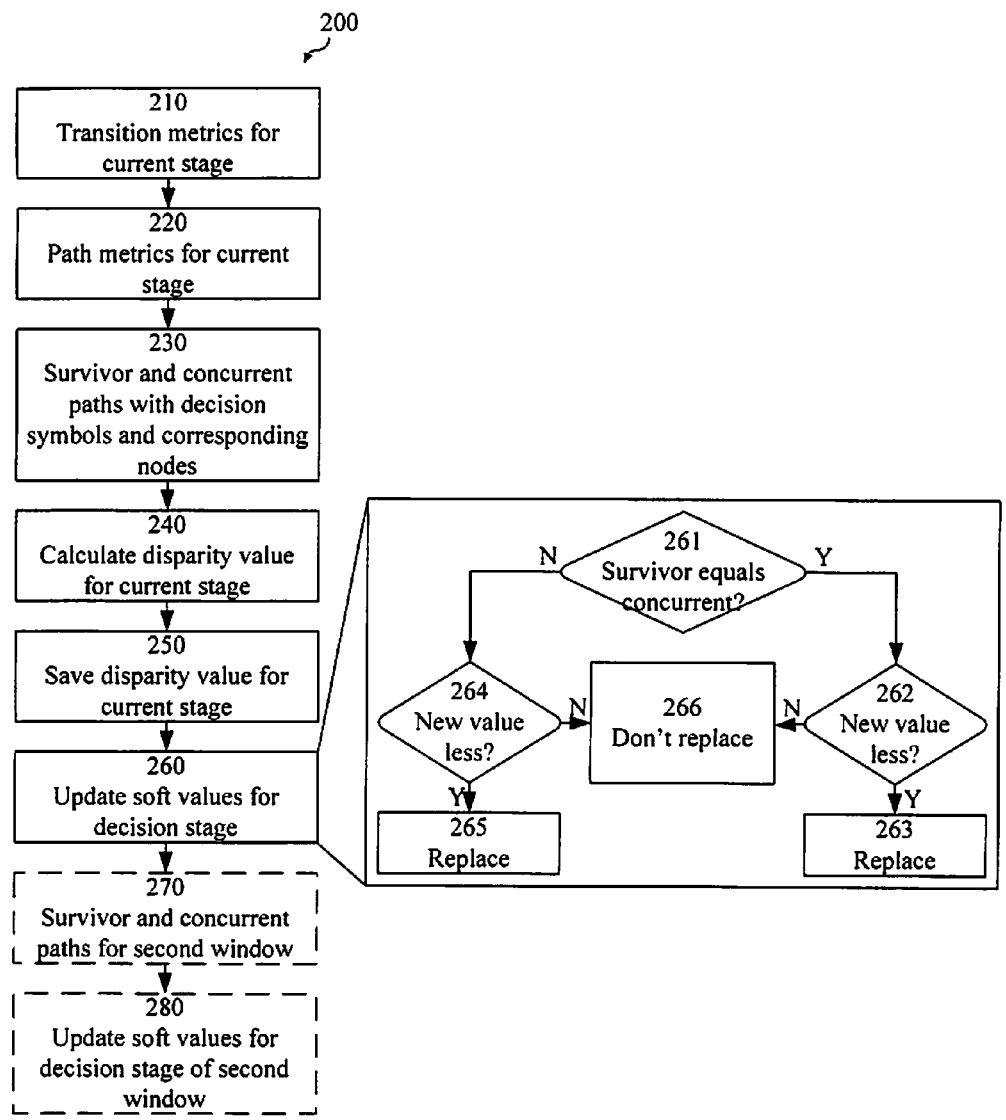
FIG. 2 is a flowchart illustrating example method steps according to some embodiments of the invention.

FIG. 2 illustrates an example method 200 that uses a sliding window approach and which may be used in a SISO decoding module. The method steps of the example method 200 may be performed for each node of each stage in the trellis representation.

Transition metrics for each incoming transition of the node are calculated in step 210, and path metrics for each incoming path are determined in step 220 based on the transition metrics and relevant node metrics of the previous stage. These operations are performed at the leading end of the sliding window (compare with node 124 of FIG. 1C).

In step 230, the surviving path and its concurrent path are determined based on the calculated path metrics. The determination may include performing trace-back or similar operations (e.g. retrieval of corresponding information from a memory unit, e.g. a register) to determine the decision bit of the surviving path and of the concurrent path (compare with 126 and 127 of FIG. 1C) and either or both of their respective reliability values.

A path disparity value (which is to be used as an initial reliability value) for the node under consideration is calculated in step 240 and stored in step 250. The path disparity value may, for example, be an absolute value of the difference between the path metrics of the surviving and concurrent paths. Other disparity values may also be considered. For example, if there are more than two incoming paths all or a subset of the path metrics may be involved in the disparity value calculation. It is noted that steps 240 and 250 may alternatively be performed before or in parallel with step 230.

In step 260, the reliability value of the decision bit of the surviving path (compare with node value 125 in FIG. 1C) may be updated if certain criteria are fulfilled as will be explained in the following.

The operations of step 260 may comprise comparing the decision bits $u_{k-U}(s)$ and $u_{k-U}(c)$ of the surviving and the concurrent paths (sub-step 261) to determine whether or not they are equal.

If they are not equal, the reliability value $L_k(s)$ for the current node and the reliability value $L_{k-U}(s)$ for the decision bit of the surviving path are compared in sub-step 264. If $L_{k-U}(s)$ is larger than $L_k(s)$, $L_{k-U}(s)$ is replaced by $L_k(s)$ in sub-step 265. Otherwise $L_{k-U}(s)$ is kept unchanged (sub-step 266).

If they are equal, a function of the reliability value $L_k(s)$ for the current node and the initial reliability value $\Delta_{k-U}(c)$ for the decision bit of the concurrent path is compared to the reliability value $L_{k-U}(s)$ for the decision bit of the surviving path in sub-step 262. If $L_{k-U}(s)$ is larger than the function value, $L_{k-U}(s)$ is replaced by the function value in sub-step 263. Otherwise $L_{k-U}(s)$ is kept unchanged (sub-step 266). As mentioned above, the function may be a summation, i.e. $L_k(s) + \Delta_{k-U}(c)$. However, other functions may be equally applicable, e.g. a weighted sum $\alpha L_k(s) + (2-\alpha)\Delta_{k-U}(c)$.

Optional steps 270 and 280 represent embodiments where a second sliding window is applied after the first sliding window has passed and where a different reliability value update rule is used than in the first window. The operations of step 270 for the second window correspond to the operations of step 230 for the first window. Similarly, the operations of step 280 for the second window correspond to the operations of step 260 for the first window with at least one criteria or value formula being different from what has been described for step 260.

Figure 3A:
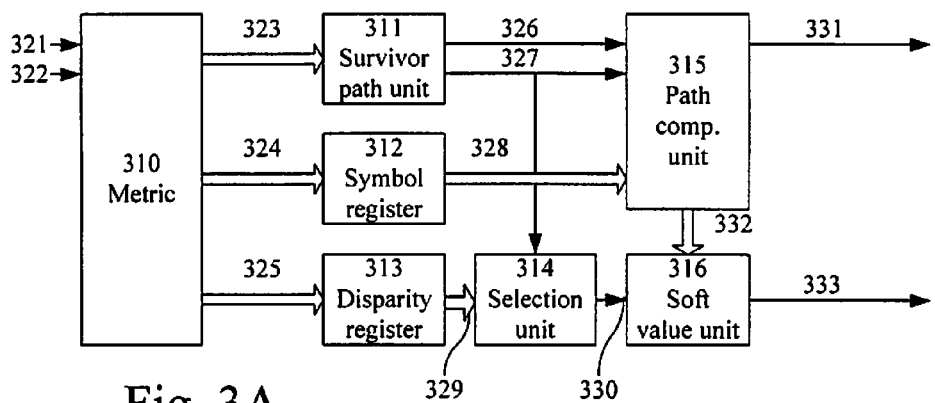
FIGS. 3A-C are block diagrams illustrating example arrangements according to some embodiments of the invention.

FIG. 3A illustrates an example decoding arrangement that may be used for HR-SOVA implementations. The arrangement comprises a metric unit 310, a survivor path unit 311, a symbol register 312, a disparity register 313, a selection unit 314, a path comparison unit 315 and a soft value unit 316.

Received intrinsic soft values and extrinsic soft values (e.g. from a previous half-iteration of another SISO module, compare with FIG. 1A) are input to the metric unit 310 as illustrated at 321 and 322. The metric unit 310 determines the preferred incoming path and calculates the corresponding disparity value (i.e. the initial reliability value) for each node of each stage of the trellis. The operations of the metric unit 310 may be compared with steps 210, 220 and 240 of FIG. 2.

The bit value 324 that corresponds to the preferred incoming path is stored in the symbol register 312 for each node, and the corresponding disparity value 325 is stored in the disparity register 313 (compare with step 250 of FIG. 2).

The bit value 323 that corresponds to the preferred incoming path is also forwarded to the survivor path unit 311, which establishes relevant information associated with the surviving path (compare with step 230—surviving path part—of FIG. 2), such as the decision bit 326 and the decision stage survivor node 327 (compare with 125 and 126 of FIG. 1C).

The information associated with the surviving path is forwarded to the path comparison unit 315 which relays the decision bit to an arrangement output 331. The path comparison unit also establishes relevant information associated with the concurrent path (compare with step 230—concurrent path part—of FIG. 2), such as the bit corresponding to the decision bit and the decision stage concurrent node. For this purpose, the path comparison unit 315 also has access to the symbol register 312 as shown at 328.

The path comparison unit 315 also compares the decision bit with the corresponding bit of the concurrent path (compare with sub-step 261 of FIG. 2) and forwards the result 332 of the comparison to the soft value unit 316, which updates reliability values accordingly (e.g. according to the Hagenauer rule) and outputs the resulting reliability values as soft values as illustrated at 333. For this purpose, the soft value unit 316 also has access to adequate information of the disparity register 314 as shown at 330. The selection unit 314 selects the appropriate disparity value 330 from the values of the disparity register 239 based on the decision stage node 327.

The registers 312 and 313, along with the survivor path unit 311, typically cover a certain number of stages of the trellis at a time and may be seen as a sliding pre-window in which traditional Viterbi algorithm operations are performed and the disparity values are prepared for further operations. The path comparison unit 315 and the soft value unit 316 typically operate in a sliding window that follows the sliding pre-window. This arrangement of the sliding pre-window and the sliding window ensures that reliability updates need only be done for the surviving path of the node that corresponds to the bit decision value (i.e. at most one update per trellis stage). Other implementations may use only a single sliding window (and no sliding pre-window), which reduces latency but increases complexity since then the reliability updates need to be done for the surviving path of each node of the trellis.

Figure 3B:
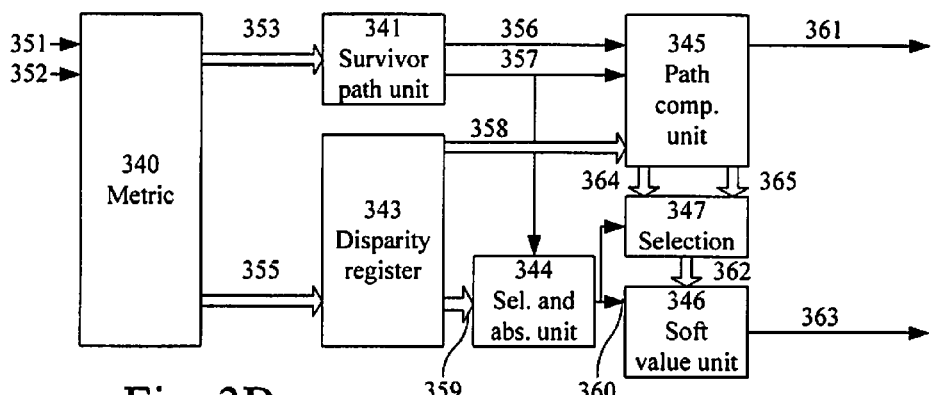

FIG. 3B illustrates another example decoding arrangement that may be used for BR-SOVA implementations or for implementations of SOVA with the modified update rule according to some embodiments of the invention. The arrangement comprises a metric unit 340, a survivor path unit 341, a disparity register 343, a selection and absolute value unit 344, a path comparison unit 345, a selection unit 347 and a soft value unit 346.

Received intrinsic soft values and extrinsic soft values (e.g. from a previous half-iteration of another SISO module, compare with FIG. 1A) are input to the metric unit 340 as illustrated at 351 and 352. The metric unit 340 determines the preferred incoming path and calculates the corresponding disparity value for each node of each stage of the trellis. The disparity values 355 are stored in the disparity register 343.

The bit value 353 that corresponds to the preferred incoming path is forwarded to the survivor path unit 341, which establishes relevant information associated with the surviving path, such as the decision bit 356 and the decision stage survivor node 357. The information associated with the surviving path is forwarded to the path comparison unit 345 which relays the decision bit to an arrangement output 361. The path comparison unit also establishes relevant information associated with the concurrent path, such as the bit corresponding to the decision bit and the decision stage concurrent node. Such information may, for example, be extracted from the sign of the disparity values (as in the Hagenauer rule). Disparity values are commonly defined as absolute values in with case their sign contains no information. Therefore, embodiments of the invention describe disparity values as signed values since such an approach simplifies the implementation of the metric unit. The absolute value of the disparity values may be determined at a later stage of the processing according to such embodiments.

The path comparison unit 345 also compares the decision bit with the corresponding bit of the concurrent path and forwards the result 365 of the comparison to the selection unit 347.

Furthermore, the path comparison unit 345 provides information 364 relevant for a possible reliability update to the selection unit 347. For BR-SOVA, such information may include (updated) reliability values of the concurrent path, while for SOVA with the modified update rule such information may include initial reliability values of the concurrent path. For this purpose, the path comparison unit 345 also has access to the disparity register 343 as shown at 358.

The selection and absolute value unit 344 selects an appropriate disparity value (i.e. the one corresponding to the surviving path) from the values of the disparity register 259 based on the decision stage node 357, and provides its absolute value 360 to the selection unit 347 and the soft value unit 346.

The selection unit 347 determined whether or not the information 364 relevant for a possible reliability update is to be used based whether or not the decision bit was equal to the corresponding bit of the concurrent path (i.e. the information provided at 365) and outputs the result at 362. Thus, for SOVA with the modified update the result at 362 may equal $L_k(s)$ if $u_{k-U}(s) \neq u_{k-U}(c)$ and $L_k(s) + \Delta_{k-U}(c)$ if $u_{k-U}(s) = u_{k-U}(c)$.

Then, the soft value unit 346 updates reliability values accordingly and outputs the resulting reliability values as soft values as illustrated at 363. For example, if either of BR-SOVA or SOVA with the modified update rule are implemented, the soft output value may compare the result at 362 with the disparity value 360 (compare with sub-steps 262 and 264 of FIG. 2) and output the least of the two (compare with sub-steps 263, 265 and 266 of FIG. 2).

Figure 3C:
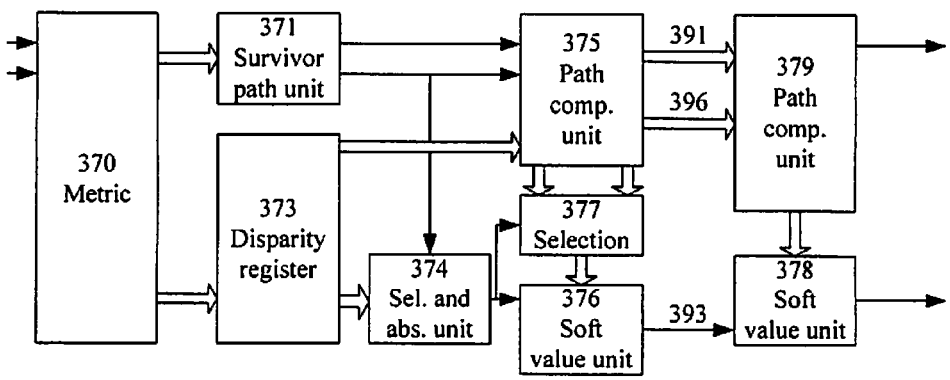

FIG. 3C illustrates yet another example decoding arrangement that may be used for a combination of two different SOVA implementations (e.g. BR-SOVA or SOVA with the modified update rule, followed by HR-SOVA) according to some embodiments of the invention.

The arrangement comprises a metric unit 370, a survivor path unit 371, a disparity register 373, a selection and absolute value unit 374, a path comparison unit 375, a selection unit 377 and a soft value unit 376. These units operate similarly or equivalently with the corresponding units 340, 341, 343, 344, 345, 347 and 346 of FIG. 3B and will therefore not be described in detail.

The arrangement further comprises a second path comparison unit 379 and a second soft value unit 378.

The path comparison unit 375 forwards the decision bits 391 and the decision stage survivor nodes 396 to the second path comparison unit 379. The soft value unit 376 forwards its resulting reliability values 393 to the second soft value unit 378, which uses them as initial reliability values. The path comparison unit 379 and the soft value unit 378 operate similarly or equivalently with the corresponding units 315 and 316 of FIG. 3A and will therefore not be described in detail. Values corresponding to the symbol register of FIG. 3A may be provided to the path comparison unit 379 in FIG. 3C e.g. by extracting the values from the sign of the disparity values as has been explained above.

The path comparison unit 375, the selection unit 377 and the soft value unit 376 typically cover a certain number of stages of the trellis at a time and may be seen as operating in a first sliding window. The path comparison unit 379 and the soft value unit 378 typically cover another certain number of stages of the trellis at a time and may be seen as operating in a second sliding window. The first and second sliding windows may or may not be overlapping, but are preferably non-overlapping for optimal performance.

It is noteworthy that the reliability update procedure used by the second soft value unit 378 differs for the reliability update procedure used by the soft value unit 376 and the selection unit 377. For example, the soft value unit 376 and the selection unit 377 may apply the modified update rule or the Battail rule, while the second soft value unit 378 may apply the Hagenauer rule.

The operations of units 375, 377 and 376 may be compared with the application of a first sliding window 140 in FIG. 1E and the operations of units 379 and 378 may be compared with the application of a second sliding window 150 in FIG. 1E and with steps 270 and 280 of FIG. 2.

Thus, according to some embodiments a method of decoding a block with a Soft Output Viterbi Algorithm (SOVA) is provided wherein the block is encoded by an encoder of a code having a trellis representation, the trellis representation having a node for each possible state of the encoder and for each stage corresponding to a symbol input occasion of the encoder, each node having at least two incoming path transitions wherein each incoming path transition corresponds to a respective possible input symbol of the encoder. In these embodiments, the SOVA uses a first sliding window wherein each position of the sliding window has a path determination stage at one end of the sliding window and a symbol decision stage at another end of the sliding window. The SOVA also uses a second sliding window wherein each position of the sliding window has a path determination stage at one end of the sliding window and a symbol decision stage at another end of the sliding window. The first and second sliding windows may preferably be non-overlapping.

The method according to such embodiments may comprise determining intermediate soft output values of the SOVA by, for each path determination stage of the first sliding window and for each node of the path determination stage: calculating a transition metric and a corresponding path metric for each incoming path transition, determining a surviving path and a concurrent path based on the path metrics, calculating a path metric disparity value based at least on the path metric of the surviving and concurrent paths, storing the path metric disparity value for the node of the path determination stage, and determining a surviving path input symbol corresponding to a path transition of the surviving path at the decision stage, a surviving decision stage node which has the path transition of the surviving path at the decision stage as an incoming path transition, a concurrent path input symbol corresponding to a path transition of the concurrent path at the decision stage, and a concurrent decision stage node which has the path transition of the concurrent path at the decision stage as an incoming path transition.

The intermediate soft output value of the surviving decision stage node may be determined as the path metric disparity value of the node of the path determination stage, if the surviving path input symbol differs from the concurrent path input symbol and if the path metric disparity value of the node of the path determination stage is less than the stored path metric disparity value of the surviving decision stage node.

If the surviving path input symbol is equal to the concurrent path input symbol and if the function of the path metric disparity value of the node of the path determination stage and the stored path metric disparity value of the concurrent decision node is less than the stored path metric disparity value of the surviving decision stage node, intermediate soft output values of the surviving decision stage node may be determined as a function of the path metric disparity value of the node of the path determination stage and the stored path metric disparity value of the concurrent decision stage node. In some embodiments, intermediate soft output values of the surviving decision stage node may instead be determined as a function of the path metric disparity value of the node of the path determination stage and a reliability value of the concurrent decision stage node, if the surviving path input symbol is equal to the concurrent path input symbol and if the function of the path metric disparity value of the node of the path determination stage and the reliability value of the concurrent decision node is less than the stored path metric disparity value of the surviving decision stage node.

Otherwise, intermediate soft output value of the surviving decision stage node may be determined as the stored path metric disparity value of the surviving decision stage node.

The method according to such embodiments may further comprise determining soft output values of the SOVA by, for each path determination stage of the second sliding window and for each node of the path determination stage: determining a concurrent path input symbol corresponding to a path transition of the concurrent path at the decision stage, and a concurrent decision stage node which has the path transition of the concurrent path at the decision stage as an incoming path transition.

The soft output values of the surviving decision stage node may be determined using rules that are different in at least one aspect from those used to determine the intermediate soft output values of the first sliding window. The soft output values of the surviving decision stage node may be determined based on at least one of the intermediate soft output values and using different criteria than in the first sliding window.

The soft output values of the surviving decision stage node may, in some embodiments, be determined as the intermediate soft output value of the node of the path determination stage, if the surviving path input symbol differs from the concurrent path input symbol and if the intermediate soft output value of the node of the path determination stage is less than the intermediate soft output value of the surviving decision stage node.

Otherwise, the soft output value of the surviving decision stage node may be determined as the intermediate soft output value of the surviving decision stage node.

A corresponding decoder may also be envisioned comprising a metric calculation unit, at least one disparity value register unit, a survivor path unit, first and second path comparison units, and first and second soft output value units. The various parts being adapted to perform respective steps of the method as described above.

These embodiments form a class of hybrid reliability updating.

An advantage with such embodiments when the modified update rule is applied in the first sliding window is that the complexity (compared to BR-SOVA or BCJR) may be even further reduced. Another advantage is that the error rate performance is not (or merely slightly) worsened compared to using only the modified update rule with a sliding window length that is equal to the sum of the lengths of the first and second sliding window lengths of the hybrid setup.

Typically, there may be a trade-off between error rate performance and complexity in these embodiments. The trade-off may be illustrated by varying the lengths of the first and second sliding windows while keeping the total window length constant.

These and other advantages may be achieved by the combination of a SOVA with low-complexity properties (e.g. HR-SOVA), and a SOVA with performance-maintaining properties (e.g. BR-SOVA or SOVA with the modified update rule).

As illustrated in FIG. 3C, one implementation achieves this by cascading the reliability update units (path comparison units 375, 376, and selection unit 377 and soft value units 376, 378) serially. By doing so, the likelihood that the reliability for the best concurrent path is eliminated within the first sliding window is reduced compared to if only HR-SOVA is used, and thus the overestimation of the extrinsic information in the HR-SOVA is less pronounced. At the same time, the complexity increase from using a SOVA with performance-maintaining properties is kept low by applying the combination with HR-SOVA.

To keep track of and to be able to obtain the relevant metric differences (disparity values) for the survivor path and/or the concurrent path in a swift and convenient way, certain implementation considerations may be attended to.

In a decoder that utilizes the Viterbi algorithm, register exchange is a low-latency method for tracing the survivor path back to a merged state in order to put out a decision symbol. Register exchange may be used for survivor management to obtain a possible hard decision symbol, as well as to track the survivor and/or concurrent paths within the reliability value update units (e.g. soft value units if FIGS. 3A-C). Traditional register exchange units perform register exchange on hard decision bits, which is useful to obtain a merged final decision bit. However, such an approach is not suitable for SOVA reliability value updates, where the metric differences for the concurrent path need to be obtained (e.g. SOVA with the modified update rule as described above).

One way of obtaining the metric difference for the concurrent path is to perform register exchange on an array of metric differences. Depending on the bit width (word length) of the metric differences, this may result in a large number of multiplexers and undesirable wiring in the circuit. An alternative way involves storing the array of metric differences in an array of shift registers. However, in such cases the sequence of concurrent states of a path typically needs to be available in order to enable selection of the relevant metric difference values. Performing direct register exchange on the (generally multi-bit) state value is possible, but is not always an optimal solution.

In the cases where the encoder takes one input bit per input occasion (e.g. for rate 1/X convolutional encoders), each state is associated with two possible input transitions and two possible output transitions, one for decision bit '0' and the other for decision bit '1'. By controlling the initial inputs to the register exchange unit and by having it exchange the minimum required information for each state transition, register exchange of states can in these situations be performed by exchanging a single bit of data.

FIG. 4A illustrates an example state register exchange unit according to some embodiments of the invention. Each stage of a corresponding trellis is represented by an appropriate number of memory elements 405, 406, 407, 408, each having a bit-width equal to one. A corresponding number of multiplexers 401, 402, 403, 404 inputs one of two possible values (either from initial input alternatives 0/1 in the first stage—411, 412, 414, 415, 417, 418, 420, 421—or from one of two previous memory element alternatives in later stages) based on the state transition having the best metric at the path determination stage 413, 416, 419, 422. This example implementation represents a minimal implementation since all of the memory elements and all wiring have a bit width equal to one.

Since only a single bit of the state value is exchanged, a transformation may be required to reconstruct the state and/or the output decision bit in case of multi-bit state values.

FIG. 4B illustrates an example of such a transformation. In this example, the encoding polynomial is utilized to extract the relevant decision bit 430 by addition 531 of corresponding memory element content of a row of the register exchange unit, while the relevant state 440 may be extracted from corresponding memory element content of a row of the register exchange unit.

By performing such transformations for an entire row of the register exchange unit, the state sequence of a path (e.g. the concurrent path) may be efficiently obtained, and the relevant metric differences may thereafter be obtained from the disparity registers.

FIG. 5 illustrates an example mobile terminal 500. The mobile terminal 500 may comprise a decoder and/or may perform methods according to embodiments of the invention. The mobile terminal 500 may, for example, comprise a decoder as described in connection to any of FIGS. 3B and 3C.

The example mobile terminal 500 may be adapted to connect to a mobile telecommunication network via the wireless link to a radio base station. To this end, the mobile terminal 500 and the base station may be compliant with at least one mobile telecommunication standard, for instance UMTS LTE (Universal Mobile Telecommunication Standard-Long Term Evolution).

The described embodiments of the invention and their equivalents may be realised in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of the invention.

The invention may be embodied within an electronic apparatus comprising circuitry/logic or performing methods according to any of the embodiments of the invention. The electronic apparatus may, for example, be radio communication apparatus, a portable or handheld mobile radio communication equipment, a mobile radio terminal, a mobile telephone, a base station, a pager, a communicator, an electronic organizer, a smartphone, a computer, a notebook, a modem, a plug-in card, or a mobile gaming device.

According to some embodiments of the invention, a computer program product comprises a computer readable medium such as, for example, a USB-stick, a diskette or a CD-ROM. FIG. 6 is a schematic drawing illustrating a computer readable medium in the form of a CD-ROM 600 according to some embodiments of the invention. The computer readable medium may have stored thereon a computer program comprising program instructions. The computer program may be loadable (as shown by arrow 610) into an electronic device 620 comprising a processing unit 640 and possibly a separate memory unit 630. The electronic device 620 may, for example, be a mobile terminal. When loaded into the electronic device 620, the computer program may be stored in the memory unit 630. According to some embodiments, the computer program may, when loaded into the electronic device 620 and run by the processing unit 640, cause the electronic device 620 to execute method steps according to, for example, the method shown in FIG. 2.

The invention has been described herein with reference to various embodiments. However, a person skilled in the art would recognize numerous variations to the described embodiments that would still fall within the scope of the invention. For example, the method embodiments described herein describes example methods through method steps being performed in a certain order. However, it is recognized that these sequences of events may take place in another order without departing from the scope of the invention. Furthermore, some method steps may be performed in parallel even though they have been described as being performed in sequence.

In the same manner, it should be noted that in the description of embodiments of the invention, the partition of functional blocks into particular units is by no means limiting to the invention. Contrarily, these partitions are merely examples. Functional blocks described herein as one unit may be split into two or more units. In the same manner, functional blocks that are described herein as being implemented as two or more units may be implemented as a single unit without departing from the scope of the invention.

Hence, it should be understood that the limitations of the described embodiments are merely for illustrative purpose and by no means limiting. Instead, the scope of the invention is defined by the appended claims rather than by the description, and all variations that fall within the range of the claims are intended to be embraced therein.

The invention claimed is:

1. A method of decoding a block with a Soft Output Viterbi Algorithm (SOVA),
wherein the block comprises a plurality of symbols having a mutual association described by a trellis representation, the trellis representation having a node for each possible state of an encoder corresponding to the trellis representation and for each stage corresponding to a symbol input occasion of the encoder, each node having at least two incoming path transitions wherein each incoming path transition corresponds to a respective possible input symbol of the encoder, and
wherein the SOVA uses a sliding window wherein each position of the sliding window has a path determination stage at one end of the sliding window and a symbol decision stage at another end of the sliding window,
the method comprising determining soft output values of the SOVA by, for each path determination stage and for each node of the path determination stage:
calculating a transition metric and a corresponding path metric for each incoming path transition;
determining a surviving path and a concurrent path based on the path metrics;
calculating a path metric disparity value based at least on the path metric of the surviving and concurrent paths;
storing the path metric disparity value for the node of the path determination stage;
determining a surviving path input symbol corresponding to a path transition of the surviving path at the decision stage, a surviving decision stage node which has the path transition of the surviving path at the decision stage as an incoming path transition, a concurrent path input symbol corresponding to a path transition of the concurrent path at the decision stage, and a concurrent decision stage node which has the path transition of the concurrent path at the decision stage as an incoming path transition; and
determining a soft output value of the surviving decision stage node as:
the path metric disparity value of the node of the path determination stage, if the surviving path input symbol differs from the concurrent path input symbol and if the path metric disparity value of the node of the path determination stage is less than the stored path metric disparity value of the surviving decision stage node;
a function of the path metric disparity value of the node of the path determination stage and the stored path metric disparity value of the concurrent decision stage node, if the surviving path input symbol is equal to the concurrent path input symbol and if the function of the path metric disparity value of the node of the path determination stage and the stored path metric disparity value of the concurrent decision node is less than the stored path metric disparity value of the surviving decision stage node; and
the stored path metric disparity value of the surviving decision stage node otherwise.

2. The method of claim 1, wherein the transition and path metrics are cumulative metrics.

3. The method of claim 1, wherein the function is a summation.

4. The method of claim 1, wherein the step of calculating the path metric disparity value comprises calculating an absolute value of the difference between the path metrics of the surviving and concurrent paths.

5. The method of claim 1, wherein the at least two incoming path transitions of each node consists of two incoming path transitions.

6. The method of claim 1, wherein the sliding window is a first sliding window and wherein the determined soft output values are intermediate soft output values, the method further comprising:
applying a second sliding window, wherein the first and second sliding windows are non-overlapping; and
determining, for each path determination stage of the second sliding window and for each node of the path determination stage, a soft output value of the surviving decision stage node of the second sliding window based on at least one of the intermediate soft output values using different criteria than in the first sliding window.

7. The method of claim 6, wherein the different criteria comprises determining the soft output value of the surviving decision stage node as the intermediate soft output value of the surviving decision stage node if the surviving path input symbol is equal to the concurrent path input symbol.

8. A non-transitory computer readable medium, having thereon a computer program comprising program instructions, the computer program being loadable into a data-processing unit and configured to cause the data-processing unit to execute the steps of a method of decoding a block with a Soft Output Viterbi Algorithm (SOVA) when the computer program is run by the data-processing unit, wherein the block comprises a plurality of symbols having a mutual association described by a trellis representation, the trellis representation having a node for each possible state of an encoder corresponding to the trellis representation and for each stage corresponding to a symbol input occasion of the encoder, each node having at least two incoming path transitions wherein each incoming path transition corresponds to a respective possible input symbol of the encoder, and wherein the SOVA uses a sliding window wherein each position of the sliding window has a path determination stage at one end of the sliding window and a symbol decision stage at another end of the sliding window, the method comprising determining soft output values of the SOVA by, for each path determination stage and for each node of the path determination stage:

calculating a transition metric and a corresponding path metric for each incoming path transition;

determining a surviving path and a concurrent path based on the path metrics;

calculating a path metric disparity value based at least on the path metric of the surviving and concurrent paths;

storing the path metric disparity value for the node of the path determination stage;

determining a surviving path input symbol corresponding to a path transition of the surviving path at the decision stage, a surviving decision stage node which has the path transition of the surviving path at the decision stage as an incoming path transition, a concurrent path input symbol corresponding to a path transition of the concurrent path at the decision stage, and a concurrent decision stage node which has the path transition of the concurrent path at the decision stage as an incoming path transition; and determining a soft output value of the surviving decision stage node as:

the path metric disparity value of the node of the path determination stage, if the surviving path input symbol differs from the concurrent path input symbol and if the path metric disparity value of the node of the path determination stage is less than the stored path metric disparity value of the surviving decision stage node;

a function of the path metric disparity value of the node of the path determination stage and the stored path metric disparity value of the concurrent decision stage node, if the surviving path input symbol is equal to the concurrent path input symbol and if the function of the path metric disparity value of the node of the path determination stage and the stored path metric disparity value of the concurrent decision node is less than the stored path metric disparity value of the surviving decision stage node; and the stored path metric disparity value of the surviving decision stage node otherwise.

9. A decoder configured to decode a block with a Soft Output Viterbi Algorithm (SOVA), wherein the block comprises a plurality of symbols having a mutual association described by a trellis representation, the trellis representation having a node for each possible state of an encoder corresponding to the trellis representation and for each stage corresponding to a symbol input occasion of the encoder, each node having at least two incoming path transitions wherein each incoming path transition corresponds to a respective possible input symbol of the encoder, and wherein the SOVA uses a sliding window wherein each position of the sliding window has a path determination stage at one end of the sliding window and a symbol decision stage at another end of the sliding window, the decoder comprising:

a metric calculation unit configured to, for each path determination stage and for each node of the path determination stage:

calculate a transition metric and a corresponding path metric for each incoming path transition; and calculate a path metric disparity value based at least on the path metric of a surviving path and a concurrent path;

at least one disparity value register unit configured to store, for each stage and node of the sliding window, the corresponding path metric disparity value;

a survivor path unit configured to, for each path determination stage and for each node of the path determination stage:

determine the surviving path based on the path metrics; and determine a surviving path input symbol corresponding to a path transition of the surviving path at the decision stage, and a surviving decision stage node which has the path transition of the surviving path at the decision stage as an incoming path transition;

a path comparison unit configured to, for each path determination stage and for each node of the path determination stage:

determine the concurrent path based on the path metrics;

determine a concurrent path input symbol corresponding to a path transition of the concurrent path at the decision stage, and a concurrent decision stage node which has the path transition of the concurrent path at the decision stage as an incoming path transition; and determine if the surviving path input symbol differs from the concurrent path input symbol;

a soft output value unit configured to, for each path determination stage and for each node of the path determination stage, determine a soft output value of the surviving decision stage node as:

the path metric disparity value of the node of the path determination stage, if the surviving path input symbol differs from the concurrent path input symbol and if the path metric disparity value of the node of the path determination stage is less than the stored path metric disparity value of the surviving decision stage node;

a function of the path metric disparity value of the node of the path determination stage and the stored path metric disparity value of the concurrent decision stage node, if the surviving path input symbol is equal to the concurrent path input symbol and if the function of the path metric disparity value of the node of the path determination stage and the stored path metric disparity value of the concurrent decision stage node is less than the stored path metric disparity value of the surviving decision stage node; and the stored path metric disparity value of the surviving decision stage node otherwise.

10. The decoder of claim 9, wherein the at least two incoming path transitions of each node consists of two incoming path transitions and further comprising a state register exchange unit wherein each register cell, corresponding to a node of the sliding window, and each register exchange connection, corresponding to a path transition between nodes, has a word length equal to one.

11. The decoder of claim 10, further comprising means to extract at least one of the concurrent decision stage node and the concurrent path input symbol from the state register exchange unit, wherein the means are configured to extract the concurrent decision stage node by combining register cell content and/or to extract the concurrent path input symbol by application of an encoding polynomial of the encoder on register cell content.

12. The decoder of claim 9, wherein the sliding window is a first sliding window, wherein the determined soft output values are intermediate soft output values, and wherein the at least one disparity value register unit is also configured to store the corresponding path metric disparity value, for each stage and node of a second sliding window wherein the first and second sliding windows are non-overlapping, the decoder further comprising:

a second soft output value unit configured to, for each path determination stage of the second sliding window and for each node of the path determination stage, determine a soft output value of the surviving decision stage node based on at least one of the intermediate soft output values using different criteria than in the first sliding window.

13. The decoder of claim 12, wherein the second soft output value unit is configured to determine the soft output value of the surviving decision stage node as the intermediate soft output value of the surviving decision stage node if the surviving path input symbol is equal to the concurrent path input symbol.

14. A radio communication apparatus comprising the decoder of claim 9.

* * * * *

UNITED STATES PATENT AND TRADEMARK OFFICE
CERTIFICATE OF CORRECTION

| | |
|---|---|
| PATENT NO. | : 8,806,312 B2 |
| APPLICATION NO. | : 13/389907 |
| DATED | : August 12, 2014 |
| INVENTOR(S) | : Kamuf et al. |

It is certified that error appears in the above-identified patent and that said Letters Patent is hereby corrected as shown below:

In the specification

In Column 9, Line 41, delete "register 314" and insert -- register 313 --, therefor.

Signed and Sealed this
Sixteenth Day of February, 2016

Michelle K. Lee
*Director of the United States Patent and Trademark Office*